(12) United States Patent
Cai

(10) Patent No.: US 11,257,888 B2
(45) Date of Patent: Feb. 22, 2022

(54) DISPLAY PANEL AND METHOD OF FABRICATING THIN FILM TRANSISTOR

(71) Applicant: SHENZHEN CHINA STAR OPTOELECTRONICS SEMICONDUCTOR DISPLAY TECHNOLOGY CO., LTD., Shenzhen (CN)

(72) Inventor: Zhenfei Cai, Shenzhen (CN)

(*) Notice: Subject to any disclaimer, the term of this patent is extended or adjusted under 35 U.S.C. 154(b) by 203 days.

(21) Appl. No.: 16/619,693

(22) PCT Filed: May 24, 2019

(86) PCT No.: PCT/CN2019/088309
§ 371 (c)(1),
(2) Date: Dec. 5, 2019

(87) PCT Pub. No.: WO2020/211158
PCT Pub. Date: Oct. 22, 2020

(65) Prior Publication Data
US 2021/0327991 A1    Oct. 21, 2021

(30) Foreign Application Priority Data

Apr. 18, 2019   (CN) .......................... 201910310872.0

(51) Int. Cl.
*H01L 27/32* (2006.01)
*H01L 29/66* (2006.01)
*H01L 29/786* (2006.01)

(52) U.S. Cl.
CPC .... *H01L 27/3272* (2013.01); *H01L 29/66742* (2013.01); *H01L 29/78633* (2013.01); *H01L 29/78696* (2013.01)

(58) Field of Classification Search
CPC .......... H01L 27/3272; H01L 29/66742; H01L 29/78633; H01L 29/78696
USPC ........................................................... 257/40
See application file for complete search history.

(56) References Cited

U.S. PATENT DOCUMENTS

| | | |
|---|---|---|
| 2004/0239825 A1 | 12/2004 | Koide et al. |
| 2016/0133681 A1* | 5/2016 | Nam ................... H01L 27/3265 257/40 |
| 2016/0370621 A1 | 12/2016 | Huang |
| 2018/0350994 A1* | 12/2018 | Hosaka ............... H01L 29/4908 |
| 2019/0088684 A1 | 3/2019 | Yu et al. |

FOREIGN PATENT DOCUMENTS

| | | |
|---|---|---|
| CN | 1550826 A | 12/2004 |
| CN | 104977764 A | 10/2015 |
| CN | 107623042 A | 1/2018 |

* cited by examiner

*Primary Examiner* — Tong-Ho Kim
(74) *Attorney, Agent, or Firm* — JMB Davis Ben-David

(57) ABSTRACT

A display panel and a method of fabricating a thin film transistor. The display panel includes a plurality of data writing thin film transistors. Each of the data writing thin film transistors includes a substrate, a light shielding metal layer, a buffer layer, an active region, a gate dielectric layer, and a gate metal layer. The active region includes a channel region and a source region and a drain region on both sides of the channel region. The data writing thin film transistor further includes a first via hole penetrating the gate dielectric layer and the buffer layer, and the gate metal layer is electrically connected to the light shielding metal layer through the first via hole.

14 Claims, 3 Drawing Sheets

DISPLAY PANEL AND METHOD OF FABRICATING THIN FILM TRANSISTOR

CROSS-REFERENCE TO RELATED APPLICATIONS

This application claims the priority to International Patent Application No. PCT/CN2019/088309, filed on May 24, 2019, which claims priority to Chinese Patent Application No. 201910310872.0, filed on Apr. 18, 2019. The entire disclosures of each of the above applications are incorporated herein by reference.

BACKGROUND OF INVENTION

Field of Invention

The present invention relates to the field of display technologies, and in particular, to a display panel and method of fabricating a thin film transistor.

Description of Prior Art

Active-matrix organic light emitting diode (AMOLED) displays are expected to replace liquid crystal displays (LCDs) as the mainstream choice for next-generation displays due to their high contrast ratio, wide viewing angles, and fast response times.

A pixel driving circuit of a large-sized AMOLED display is shown in FIG. 1. Thin film transistors T1 and T2 are used for data writing, and thin film transistor T3 is used for signal driving. T3 typically operates in a saturation region and a voltage applied on T3 is typically a forward bias voltage. T1 and T2 operate in a linear region, and a voltage applied on T1 and T2 is typically a negative bias voltage.

Technical Problem

In a pixel driving circuit of an AMOLED display, light-shielding metal layer is not used in T1 and T2 due to fabricating process limitations, and the increase of illumination will lead to a threshold voltage drift of the thin film transistor under a negative bias voltage. Therefore, due to an influence of ambient light illumination and pixel driving voltage, threshold voltages of T1 and T2 are prone to negative drift. When the negative drift is too large, T1 and T2 will not be able to be turned off, causing the driving circuit failing to write data and generating flicker on the display panel.

Therefore, it is necessary to improve the prior art.

SUMMARY OF INVENTION

The present invention provides a display panel and a method of fabricating a thin film transistor to improve the stability of a data writing thin film transistor.

In order to solve the above problems, the present invention provides a display panel, wherein the display panel comprises a thin film transistor layer, the thin film transistor layer comprising a plurality of driving thin film transistors and a plurality of data writing thin film transistors;

wherein each of the data writing thin film transistors comprises:

a substrate;

a light shielding metal layer, the light shielding metal layer is located on the substrate;

a buffer layer, the buffer layer covering the light shielding metal layer;

an active region, the active region is located on the buffer layer, the active region comprises a channel region and a source region and a drain region located on both sides of the channel;

a gate dielectric layer, the gate dielectric layer covering the channel region;

a gate metal layer, the gate metal layer covering the gate dielectric layer; and each of the data writing thin film transistors further comprises a first via hole penetrating the gate dielectric layer and the buffer layer, and the gate metal layer is electrically connected to the light shielding metal layer through the first via hole;

an interlayer dielectric layer covering the gate metal layer and the active region;

a second via hole, the second via hole is located on the interlayer dielectric layer and exposing the source region and the drain region;

a source/drain metal layer, the source/drain metal layer located on the interlayer dielectric layer and electrically connected to the source region and the drain region through the second via hole.

According to one aspect of the invention, wherein the first via hole is located on an extension line of the channel region in a channel width direction.

According to one aspect of the invention, wherein a length of the gate metal layer is greater than a length of the channel region, and the gate metal layer extends toward the first via hole and covers the first via hole.

According to one aspect of the invention, wherein an area of the light shielding metal layer is larger than an area of the gate metal layer, and a projection of the light-shielding metal layer on the substrate completely covers a projection of the gate metal layer on the substrate.

According to one aspect of the invention, wherein an area of the light shielding metal layer is larger than an area of the active region, and a projection of the light-shielding metal layer on the substrate completely covers a projection of the active region on the substrate.

According to one aspect of the invention, wherein the projection of the light-shielding metal layer on the substrate completely covers the projection of the active region on the substrate and a projection of the first via hole on the substrate.

The present invention further provides a display panel, wherein the display panel comprises a thin film transistor layer, the thin film transistor layer comprising a plurality of driving thin film transistors and a plurality of data writing thin film transistors;

wherein each of the data writing thin film transistors comprises:

a substrate;

a light shielding metal layer, the light shielding metal layer is located on the substrate;

a buffer layer, the buffer layer covering the light shielding metal layer;

an active region, the active region is located on the buffer layer, the active region comprises a channel region and a source region and a drain region located on both sides of the channel;

a gate dielectric layer, the gate dielectric layer covering the channel region;

a gate metal layer, the gate metal layer covering the gate dielectric layer; and each of the data writing thin film transistors further comprises a first via hole penetrating the gate dielectric layer and the buffer layer, and the gate metal layer is electrically connected to the light shielding metal layer through the first via hole.

According to one aspect of the invention, wherein the first via hole is located on an extension line of the channel region in a channel width direction.

According to one aspect of the invention, wherein a length of the gate metal layer is greater than a length of the channel region, and the gate metal layer extends toward the first via hole and covers the first via hole.

According to one aspect of the invention, wherein an area of the light shielding metal layer is larger than an area of the gate metal layer, and a projection of the light-shielding metal layer on the substrate completely covers a projection of the gate metal layer on the substrate.

According to one aspect of the invention, wherein an area of the light shielding metal layer is larger than an area of the active region, and a projection of the light-shielding metal layer on the substrate completely covers a projection of the active region on the substrate.

According to one aspect of the invention, wherein the projection of the light-shielding metal layer on the substrate completely covers the projection of the active region on the substrate and a projection of the first via hole on the substrate.

According to one aspect of the invention, wherein each of the data writing thin film transistors further comprises:

an interlayer dielectric layer covering the gate metal layer and the active region;

a second via hole, the second via hole is located on the interlayer dielectric layer and exposing the source region and the drain region;

a source/drain metal layer, the source/drain metal layer located on the interlayer dielectric layer and electrically connected to the source region and the drain region through the second via hole.

The present invention further provides a method of fabricating a thin film transistor, wherein the method comprises:

providing a substrate;

forming a light shielding metal layer, the light shielding metal layer being located on the substrate;

forming a buffer layer, the buffer layer covering the light shielding metal layer;

forming an active region on the buffer layer, the active region comprising a channel region and a source region and a drain region on both sides of the channel region;

forming a gate dielectric layer, the gate dielectric layer covering the channel region;

forming a first via hole, the first via hole penetrating the gate dielectric layer and the buffer layer;

forming a gate metal layer covering the gate dielectric layer, and the gate metal layer is electrically connected to the light shielding metal layer through the first via hole.

According to one aspect of the invention, wherein the first via hole is located on an extension line of the channel region along a channel width direction;

wherein a length of the gate metal layer is greater than a length of the channel region, and the gate metal layer extends toward the first via hole and covers the first via hole.

According to one aspect of the invention, wherein the method further comprises:

forming an interlayer dielectric layer covering the gate metal layer and the active region;

forming a second via hole on the interlayer dielectric layer to expose the source region and the drain region;

forming a source/drain metal layer on the interlayer dielectric layer and electrically connecting the source region and drain region through the second via hole.

Beneficial Effect

The present invention optimizes data writing thin film transistors in a display panel, a light shielding metal is disposed in the buffer layer, and the light shielding metal and the gate electrode are electrically connected through via holes. This arrangement enables shading to prevent external light from affecting the mobility of carriers in the active region. At the same time, the gate metal and the gate electrode are electrically connected, which effectively increases the area of the gate metal, thereby enhancing the gate control capability of the transistor.

DETAILED DESCRIPTION OF PREFERRED EMBODIMENTS

Figure 1:
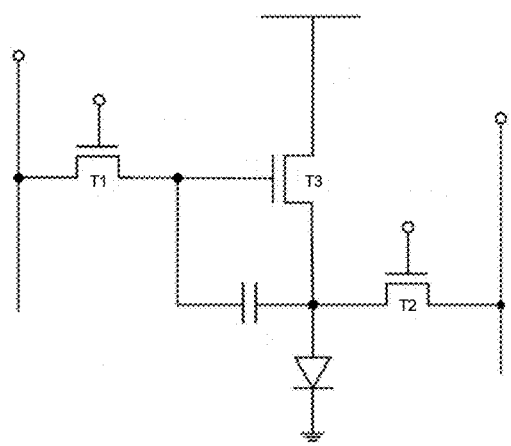
FIG. 1 is a circuit diagram of a driving circuit of a display panel in the prior art.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

Figure 4:
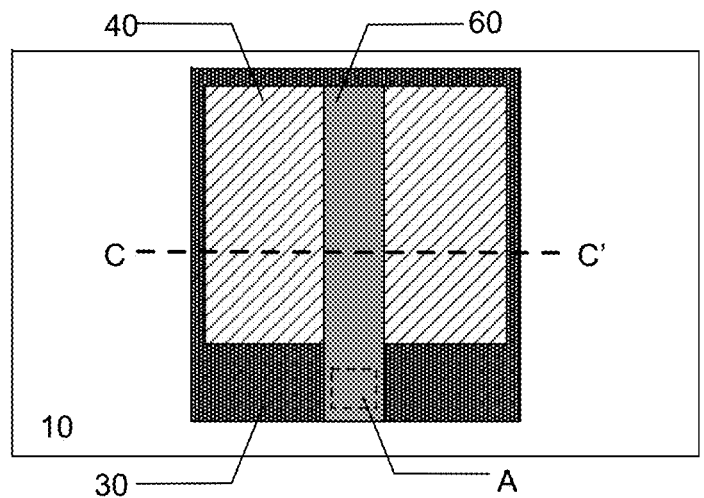
FIG. 4 is a top view of the thin film transistor of FIG. 3.
Figure 5:
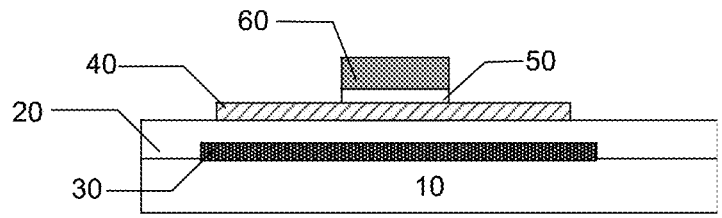
FIG. 5 is a structural diagram of a thin film transistor after gate patterning in an embodiment of the present invention.

The invention will be described in detail in connection with specific embodiments. In order to solve the above problems, the present invention provides a display panel including a thin film transistor layer including a plurality of driving thin film transistors and a plurality of data writing thin film transistors. Referring to FIGS. 2 to 5, FIG. 2 is a structural diagram of a thin film transistor after a gate dielectric layer and a first via hole are formed in an embodiment of the present invention, FIG. 3 is a structural diagram of a thin film transistor after a gate metal is formed in an embodiment of the present invention, FIG. 4 is a top view of the thin film transistor of FIG. 3, FIG. 5 is a structural diagram of a thin film transistor after gate patterning in an embodiment of the present invention.

As shown in FIG. 3, in the embodiment, each of the data writing thin film transistors includes a substrate 10, a light shielding metal layer 30, a buffer layer 20, an active region 40, a gate dielectric layer 50, and a gate metal layer 60.

The light shielding metal layer 30 is located on the substrate 10. The light shielding metal layer 30 can be made of a metal material having good light shielding properties and having good conductivity, such as copper, aluminum, or iron. The buffer layer 20 covers the light shielding metal layer 30. The material forming the buffer layer 20 is a transparent insulating material such as silicon oxide or silicon nitride. The active region 40 is located on the buffer layer 20. The active region 40 includes a channel region and a source region and a drain region located on both sides of the channel region. The source region and drain region can be formed by in-situ doping or can be formed by ion implantation. In the present embodiment, the method of in-situ doping is preferably used to simultaneously form the source region and drain region when forming the active region, so that the doping concentration of the source region and drain region can be more uniform.

Referring to FIG. 4 and FIG. 5, FIG. 5 is a cross-sectional diagram of the thin film transistor structure of FIG. 4 taken along a CC' direction. The gate dielectric layer 50 covers the channel region, and the gate metal layer 60 covers the gate dielectric layer 50.

Figure 2:
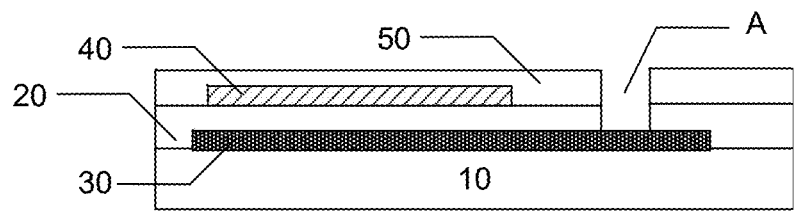
FIG. 2 is a structural diagram of a thin film transistor after a gate dielectric layer and a first via hole are formed in an embodiment of the present invention.
Figure 3:
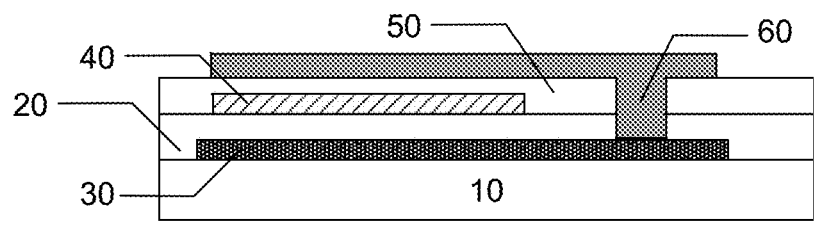
FIG. 3 is a structural diagram of a thin film transistor after a gate metal is formed in an embodiment of the present invention.

In this embodiment, referring to FIG. 2 and FIG. 3, the data writing thin film transistor further includes a first via hole A penetrating the gate dielectric layer 50 and the buffer layer 20, the gate metal layer 60 is electrically connected to the light shielding metal layer 30 through the first via hole A. The first via hole A is located on an extension line of the channel region along a channel width direction. Wherein, a channel length direction is a direction from the source region to the drain region, the channel width direction is perpendicular to the channel length direction. The length of the gate metal layer 60 is greater than the length of the channel region. The gate metal layer 60 extends toward the first via hole A and covers the first via hole A.

In the present application, an area of the light shielding metal layer 30 is larger than an area of the active region 40, and a projection of the light shielding metal layer 30 on the substrate 10 completely covers a projection of the active region 40 on the substrate 10. Preferably, in this embodiment, the projection of the light shielding metal layer 30 on the substrate 10 completely covers the projection of the active region 40 on the substrate 10 and a projection of the first via A on the substrate 10.

The present invention provides a light shielding metal layer in the buffer layer, and connects the light shielding metal layer and the gate metal layer through the via hole. This arrangement enables a function of light shielding and can prevent external light from affecting the mobility of carriers in the active region 40. At the same time, the light shielding metal layer and the gate metal layer are electrically connected, which effectively increases the area of the gate metal, thereby enhancing the gate control capability of the transistor.

As shown in FIG. 6 to FIG. 9, in the present embodiment, each of the data writing thin film transistors further includes an interlayer dielectric layer 70, a source/drain metal layer 80, and a planarization layer 90.

Figure 6:
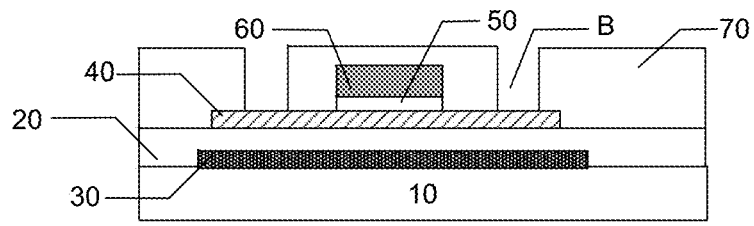
FIG. 6 is a structural diagram of a thin film transistor after a second via hole is formed in an embodiment of the present invention.

Referring to FIG. 6, FIG. 6 is a structural diagram of a thin film transistor after a second via hole is formed in an embodiment of the present invention. The interlayer dielectric layer 70 covers the gate metal layer 60 and the active region 40, and the second via hole B is located on the interlayer dielectric layer 70 to expose the source region and drain region.

Figure 7:
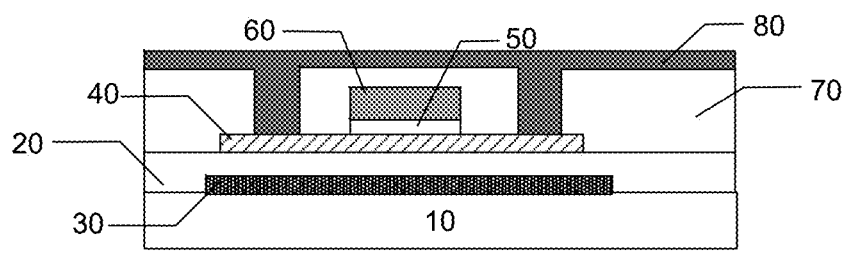
FIG. 7 is a structural diagram of a thin film transistor after a source/drain electrode is fabricated in an embodiment of the present invention.
Figure 8:
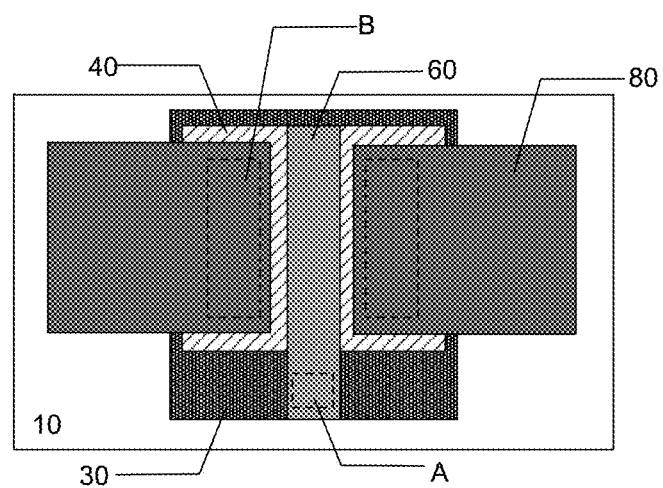
FIG. 8 is a top view of the thin film transistor of FIG. 7.

Referring to FIG. 7 and FIG. 8, FIG. 7 is a structural diagram of a thin film transistor after a source/drain electrode is fabricated in an embodiment of the present invention, FIG. 8 is a top view of the thin film transistor of FIG. 7. The source/drain metal layer 80 is located on the interlayer dielectric layer 70, and is electrically connected to the source region and drain region through the second via hole B.

Figure 9:
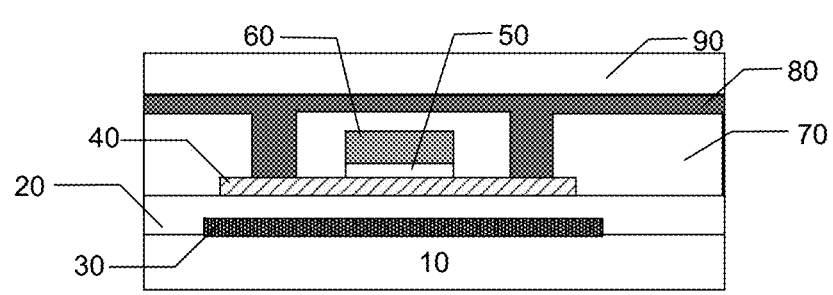
FIG. 9 is a structural diagram of a thin film transistor after a planarization layer is formed in an embodiment of the present invention.

Finally, as shown in FIG. 9, the planarization layer 90 covering the source/drain metal layer 80 is formed.

Correspondingly, referring to FIG. 2 to FIG. 9, the present invention also provides a method for fabricating a thin film transistor, which will be described in detail below with reference to the accompanying drawings.

First, as shown in FIG. 2, a substrate 10 is provided, and a light shielding metal layer 30 is formed on the substrate 10. Thereafter a buffer layer 20 is formed, and the buffer layer 20 covers the light shielding metal layer 30. Then, an active region 40 is formed, the active region 40 is located on the buffer layer 20, the active region 40 comprising a channel region and a source region and a drain region on both sides of the channel region. A gate dielectric layer 50 is then formed, which covers the channel region. Thereafter, a first via hole A is formed and penetrates through the gate dielectric layer 50 and the buffer layer 20.

Thereafter, as shown in FIG. 3, a gate metal layer 60 is formed, the gate metal layer 60 covers the gate dielectric layer 50, and the gate metal layer 60 is electrically connected to the light shielding metal layer 30 through the first via hole A. As shown in FIG. 4, the first via hole A is located on an extension line of the channel region along a channel width direction. Wherein, a channel length direction is a direction from the source region to the drain region, the channel width direction is perpendicular to the channel length direction. The length of the gate metal layer 60 is greater than the length of the channel region. The gate metal layer 60 extends toward the first via hole A and covers the first via hole A.

Referring to FIG. 4 and FIG. 5, FIG. 5 is a cross-sectional diagram of the thin film transistor structure of FIG. 4 taken along a CC' direction. The gate dielectric layer 50 covers the channel region, and the gate metal layer 60 covers the gate dielectric layer 50.

In the present application, an area of the light shielding metal layer 30 is larger than an area of the active region 40, and a projection of the light shielding metal layer 30 on the substrate 10 completely covers a projection of the active region 40 on the substrate 10. Preferably, in this embodiment, the projection of the light shielding metal layer 30 on the substrate 10 completely covers the projection of the active region 40 on the substrate 10 and a projection of the first via A on the substrate 10.

The present invention provides a light shielding metal layer in the buffer layer, and connects the light shielding metal layer and the gate metal layer through the via hole. This arrangement enables a function of light shielding and can prevent external light from affecting the mobility of carriers in the active region 40. At the same time, the light shielding metal layer and the gate metal layer are electrically connected, which effectively increases the area of the gate metal, thereby enhancing the gate control capability of the transistor.

Referring to FIG. 6, FIG. 6 is a structural diagram of a thin film transistor after a second via hole is formed in an embodiment of the present invention. The interlayer dielectric layer 70 covers the gate metal layer 60 and the active region 40, and the second via hole B is located on the interlayer dielectric layer 70 to expose the source region and drain region.

Referring to FIG. 7 and FIG. 8, FIG. 7 is a structural diagram of a thin film transistor after a source/drain electrode is fabricated in an embodiment of the present invention, FIG. 8 is a top view of the thin film transistor of FIG. 7. The source/drain metal layer 80 is located on the interlayer dielectric layer 70, and is electrically connected to the source region and drain region through the second via hole B.

Finally, as shown in FIG. 9, the planarization layer 90 covering the source/drain metal layer 80 is formed.

The present invention optimizes data writing thin film transistors in a display panel, a light shielding metal is disposed in the buffer layer, and the light shielding metal and the gate electrode are electrically connected through via holes. This arrangement enables shading to prevent external light from affecting the mobility of carriers in the active region. At the same time, the gate metal and the gate electrode are electrically connected, which effectively increases the area of the gate metal, thereby enhancing the gate control capability of the transistor.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A display panel, wherein the display panel comprises a thin film transistor layer, the thin film transistor layer comprising a plurality of driving thin film transistors and a plurality of data writing thin film transistors;
    wherein each of the data writing thin film transistors comprises:
        a substrate;
        a light shielding metal layer, the light shielding metal layer is located on the substrate;
        a buffer layer, the buffer layer covering the light shielding metal layer;
        an active region, the active region is located on the buffer layer, the active region comprises a channel region and a source region and a drain region located on both sides of the channel;
        a gate dielectric layer, the gate dielectric layer covering the channel region;
        a gate metal layer, the gate metal layer covering the gate dielectric layer; and
        each of the data writing thin film transistors further comprises a first via hole penetrating the gate dielectric layer and the buffer layer, and the gate metal layer is electrically connected to the light shielding metal layer through the first via hole;
        an interlayer dielectric layer covering the gate metal layer and the active region;
        a second via hole, the second via hole is located on the interlayer dielectric layer and exposing the source region and the drain region;
        a source/drain metal layer, the source/drain metal layer located on the interlayer dielectric layer and electrically connected to the source region and the drain region through the second via hole;
    wherein an area of the light shielding metal layer is larger than an area of the active region, and a projection of the light-shielding metal layer on the substrate completely covers a projection of the active region on the substrate.

2. The display panel according to claim 1, wherein the first via hole is located on an extension line of the channel region in a channel width direction.

3. The display panel according to claim 2, wherein a length of the gate metal layer is greater than a length of the channel region, and the gate metal layer extends toward the first via hole and covers the first via hole.

4. The display panel according to claim 3, wherein the area of the light shielding metal layer is larger than an area of the gate metal layer, and the projection of the light-shielding metal layer on the substrate completely covers a projection of the gate metal layer on the substrate.

5. The display panel according to claim 1, wherein the projection of the light-shielding metal layer on the substrate completely covers the projection of the active region on the substrate and a projection of the first via hole on the substrate.

6. A display panel, wherein the display panel comprises a thin film transistor layer, the thin film transistor layer comprising a plurality of driving thin film transistors and a plurality of data writing thin film transistors;
    wherein each of the data writing thin film transistors comprises:
        a substrate;
        a light shielding metal layer, the light shielding metal layer is located on the substrate;
        a buffer layer, the buffer layer covering the light shielding metal layer;
        an active region, the active region is located on the buffer layer, the active region comprises a channel region and a source region and a drain region located on both sides of the channel;
        a gate dielectric layer, the gate dielectric layer covering the channel region;
        a gate metal layer, the gate metal layer covering the gate dielectric layer; and
        each of the data writing thin film transistors further comprises a first via hole penetrating the gate dielectric layer and the buffer layer, and the gate metal layer is electrically connected to the light shielding metal layer through the first via hole;
    wherein an area of the light shielding metal layer is larger than an area of the active region, and a projection of the light-shielding metal layer on the substrate completely covers a projection of the active region on the substrate.

7. The display panel according to claim 6, wherein the first via hole is located on an extension line of the channel region in a channel width direction.

8. The display panel according to claim 7, wherein a length of the gate metal layer is greater than a length of the channel region, and the gate metal layer extends toward the first via hole and covers the first via hole.

9. The display panel according to claim 8, wherein the area of the light shielding metal layer is larger than an area of the gate metal layer, and the projection of the light-shielding metal layer on the substrate completely covers a projection of the gate metal layer on the substrate.

10. The display panel according to claim 6, wherein the projection of the light-shielding metal layer on the substrate completely covers the projection of the active region on the substrate and a projection of the first via hole on the substrate.

11. The display panel according to claim 6, wherein each of the data writing thin film transistors further comprises:
   an interlayer dielectric layer covering the gate metal layer and the active region;
   a second via hole, the second via hole is located on the interlayer dielectric layer and exposing the source region and the drain region;
   a source/drain metal layer, the source/drain metal layer located on the interlayer dielectric layer and electrically connected to the source region and the drain region through the second via hole.

12. A method of fabricating a thin film transistor, wherein the method comprises:
   providing a substrate;
   forming a light shielding metal layer, the light shielding metal layer being located on the substrate;
   forming a buffer layer, the buffer layer covering the light shielding metal layer;
   forming an active region on the buffer layer, the active region comprising a channel region and a source region and a drain region on both sides of the channel region;
   forming a gate dielectric layer, the gate dielectric layer covering the channel region;
   forming a first via hole, the first via hole penetrating the gate dielectric layer and the buffer layer;
   forming a gate metal layer covering the gate dielectric layer, and the gate metal layer is electrically connected to the light shielding metal layer through the first via hole;
   wherein an area of the light shielding metal layer is larger than an area of the active region, and a projection of the light-shielding metal layer on the substrate completely covers a projection of the active region on the substrate.

13. The method of fabricating a thin film transistor according to claim 12, wherein the first via hole is located on an extension line of the channel region along a channel width direction;
   wherein a length of the gate metal layer is greater than a length of the channel region, and the gate metal layer extends toward the first via hole and covers the first via hole.

14. The method of fabricating a thin film transistor according to claim 12, wherein the method further comprises:
   forming an interlayer dielectric layer covering the gate metal layer and the active region;
   forming a second via hole on the interlayer dielectric layer to expose the source region and the drain region;
   forming a source/drain metal layer on the interlayer dielectric layer and electrically connecting the source region and drain region through the second via hole.

\* \* \* \* \*